(12) United States Patent
Lany

(10) Patent No.: US 9,362,429 B2
(45) Date of Patent: Jun. 7, 2016

(54) PHOTOVOLTAIC SEMICONDUCTOR MATERIALS BASED ON ALLOYS OF TIN SULFIDE, AND METHODS OF PRODUCTION

(71) Applicant: Alliance for Sustainable Energy, LLC, Golden, CO (US)

(72) Inventor: Stephan Lany, Arvada, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 302 days.

(21) Appl. No.: 14/266,213

(22) Filed: Apr. 30, 2014

(65) Prior Publication Data

US 2014/0318623 A1 Oct. 30, 2014

Related U.S. Application Data

(60) Provisional application No. 61/817,569, filed on Apr. 30, 2013.

(51) Int. Cl.
| | |
|---|---|
| *H01L 31/032* | (2006.01) |
| *H01L 31/00* | (2006.01) |
| *H01B 1/04* | (2006.01) |
| *H01L 21/20* | (2006.01) |

(52) U.S. Cl.
CPC .............. *H01L 31/0324* (2013.01); *H01B 1/04* (2013.01); *H01L 21/20* (2013.01); *H01L 31/00* (2013.01); *H01L 31/032* (2013.01)

(58) Field of Classification Search
CPC ... H01L 31/0324; H01L 31/032; H01L 21/20; H01L 31/03; H01L 31/00; H01B 1/44

USPC ............... 136/252, 255, 256, 258, 260; 252/519.14, 500; 257/E21.411; 438/478

See application file for complete search history.

(56) References Cited

U.S. PATENT DOCUMENTS

| RE39,640 E | 5/2007 | Kanatzidis et al. | |
|---|---|---|---|
| 2006/0127562 A1 | 6/2006 | Lewis et al. | |
| 2006/0270197 A1* | 11/2006 | Ho | H01L 29/66969 438/478 |
| 2010/0032008 A1 | 2/2010 | Adekore | |
| 2010/0236614 A1 | 9/2010 | Klimov et al. | |
| 2012/0152347 A1 | 6/2012 | Lee et al. | |

OTHER PUBLICATIONS

K.T. Ramakrishna Reddy, "Photovoltaic properties of SnS based solar cells" Solar Energy Materials & Solar Cells 90 (2006) 3041-3046.*
Albers et al., "Investigations on SnS", Journal of Applied Physics, Oct. 1961, Supplement to vol. 32, No. 10, pp. 2220-2225.
Botti et al., "Band Structures of Cu2ZnSnS4 and Cu2ZnSnSe4 from Many-body Methods", Applied Physics Letters, 2011, vol. 98, pp. 241915-1-241915-3.
Fuchs et al., "Quasiparticle Band Structure Based on a Generalized Kohn-Sham scheme", Physical Review B, 2007, vol. 76, pp. 115109-1-115109-8.

(Continued)

*Primary Examiner* — Jeffrey T Barton
*Assistant Examiner* — Michael Y Sun
(74) *Attorney, Agent, or Firm* — Robert G. Pittelkow

(57) ABSTRACT

Photovoltaic thin-film materials comprising crystalline tin sulfide alloys of the general formula $Sn_{1-x}(R)_xS$, where R is selected from magnesium, calcium and strontium, as well as methods of producing the same, are disclosed.

20 Claims, 8 Drawing Sheets

(56) References Cited

OTHER PUBLICATIONS

Hartman et al., "SnS Thin-films by RF Sputtering at Room Temperature", Thin Solid Films, 2011, vol. 519, pp. 7421-7424.

Lany et al., "Assessment of Correction Methods for the Band Gap Problem and for the Finite-size Effects in Supercell Defect Calculations: Case Studies for ZnO and GaAs", Physical Review B, 2008, vol. 78, pp. 235104-1-235104-25.

Lany et al., "Halogen n-type Doping of Chalcopyrite Semiconductors", Applied Physics Letters, 2005, vol. 86, pp. 042109-1-042109-3.

Lany et al., "Origins of the doping Asymmetry in Oxides: Hole doping in NiO Versus Electron Doping in ZnO", Physical Review B, 2007, vol. 75, pp. 241203-1-241203-4.

Miles et al, "Thermally Evaporated Thin Films of SnS for Application in Solar Cell Devices", Thin Solid Films, 2009, vol. 517, pp. 4702-4705.

Noguchi et al., "Characterization of Vacuum-evaporated Tin Sulfide Film for Solar Cell Materials", Solar Energy Materials and Solar Cells, Sep. 11, 1994, vol. 35, pp. 325-331.

Reddy et al., "Photovoltaic Properties of SnS Based Solar Cells", Solar Energy Materials and Solar Cells, Jul. 2006, vol. 90, pp. 3041-3046.

Sinsermsuksakul et al., "Atomic Layer Deposition of Tin Monosulfide Thin Films", Advanced Energy Materials, Nov. 2011, vol. 1, No. 6, pp. 1116-1125.

Sugiyama et al., "Sulfurization Growth of SnS Thin Films and Experimental Determination of Valence Band Discontinuity for SnS-Related Solar Cells", Japanese Journal of Applied Physics, 2011, vol. 50, pp. 05HF03-1-05HF03-3.

van Schilfgaarde et al., "Quasiparticle Self-Consistent GW Theory", Physical Review Letters, Jun. 2006, vol. 96, pp. 226402-1-226402-4.

Vidal et al., "Band-structure, Optical Properties, and Defect Physics of the Photovoltaic Semiconductor SnS", Applied Physics Letters, 2012, vol. 100, pp. 032104-1-032104-4.

Viney et al., "Electrical and Optical Simulation of Luminescence in Ca1-xCdxS", Journal of Crystal Growth, Apr. 1994, vol. 138, pp. 1055-1060.

Wadia et al., "Materials Availability Expands the Opportunity for Large-Scale Photovoltaic Deployment", Environmental Science & Technology, 2009, vol. 43, No. 6, pp. 2072-2077.

Zunger et al., "Special Quasirandom Structures", Physical Review Letters, Jul. 16, 1990, vol. 65, No. 3, pp. 353-356.

Vidal et al., "Structural and Electronic Modification of Photovoltaic SnS by Alloying", Journal of Applied Physics, 2014, vol. 115, pp. 113507-1-113507-6.

* cited by examiner

PHOTOVOLTAIC SEMICONDUCTOR MATERIALS BASED ON ALLOYS OF TIN SULFIDE, AND METHODS OF PRODUCTION

CROSS-REFERENCE TO RELATED APPLICATIONS

This application claims priority under 35 U.S.C. §119 (e) from U.S. Provisional Application Ser. No. 61/817,569 filed on Apr. 30, 2013, the contents of which are incorporated by reference herein in their entirety.

CONTRACTUAL ORIGIN

The United States Government has rights in this invention under Contract No. DE-AC36-08GO28308 between United States Department of Energy and Alliance for Sustainable Energy, LLC, the Manager and Operator of the National Renewable Energy Laboratory.

BACKGROUND

Photovoltaic (PV) technologies based on inorganic thin film absorber materials may enable cost-effective solar energy production at large scales. Thin film technologies reduce the amount of material required in creating the active material of photovoltaic devices, such as solar cells. Crystalline silicon solar cells are very successful and presently dominate the market, but this technology has intrinsic limitations originating from the strongly indirect band structure character of crystalline silicon (c-Si). In particular, a rather thick absorber layer (typically ~150 μm) with very low defect densities is required, which mandates a fairly complex fabrication process. New successful thin-film materials made from other materials could lead to a diversification of PV technologies with increased competition and independent supply chains, thereby mitigating the danger of market volatilities. There is increasing concern that the leading thin film technologies, CdTe and $Cu(In,Ga)Se_2$ (CIGS), rely on elements that are toxic (Cd) or rare (Te and In). Use of these materials, therefore, may be unsustainable and/or not cost-effective, which has spurred active research in earth-abundant PV materials.

Tin sulfide (SnS) based absorber materials offer an alternative for photovoltaic applications, however, the efficiencies achieved with SnS based solar cells are low (less than 2%). SnS has also attracted interest as an earth abundant PV absorber that can be grown by a wide range of physical and chemical deposition techniques, in the orthorhombic (orth) structure, however there are additional limitations associated with use of SnS. Besides the need for device optimization, e.g., developing hetero junction partner materials and contact layers, there are also materials-intrinsic barriers that are related to the anisotropic crystal structure of SnS. First, the orthorhombic ground state of SnS (orth-SnS) has an indirect band gap of 1.07 eV and only at energies above about 1.4-1.5 eV is the absorption coefficient is above $10^4$ $cm^{-1}$, the value needed for sufficiently complete absorption in a thin film with thickness no more than a few μm. While the indirect band gap character of SnS is much less pronounced than in c-Si, where the direct gap lies in the ultraviolet, it nevertheless implies a considerable loss of about 0.3 eV in the achievable open-circuit voltage of a thin-film solar cell. Second, the anisotropic character of the band-structure causes relatively high effective masses for holes in the direction perpendicular to the planes of the layered SnS structure, which reduces the mobility in this direction and is likely to impede the collection of photo-excited carriers.

Additional limitations of SnS as a PV absorber appear to lie in its peculiar crystal structure. The polymorphism of SnS has been investigated to some extent, with various experimental conclusions having been reached about observation of a zinc blende phase, a high temperature orthorhombic phase, and a rock salt phase (rs-SnS). rs-SnS is just 40 meV/atom higher in energy than orth-SnS, and may be stabilized by epitaxial growth on a NaCl substrate.

Photovoltaics also require, in addition to an absorber layer, a transparent front contact layer. The transparent front contact is an important materials component in solar cells. In a heterojunction device, this material receives the photogenerated electrons, while the holes are transported through the absorber materials to the back contact. For optimal device performance, the conduction band minimum (CBM) of the front contact should line up with the CBM of the absorber material. Cadmium sulfide (CdS) is a common front contact (buffer) material which is used, e.g., in the $Cu(In,Ga)Se_2$ and CdTe thin-film technologies. However, as mentioned above for SnS based solar cells, there is an indirect band gap of SnS due to which a significant fraction of solar photons with energies above the band gap is not absorbed and does not contribute to the photocurrent. There is also a non-optimal conduction band offset between the SnS absorber and the CdS buffer layers.

The foregoing examples of the related art and limitations related therewith are intended to be illustrative and not exclusive. Other limitations of the related art will become apparent to those of skill in the art upon a reading of the specification and a study of the drawings.

SUMMARY

In a first aspect, disclosed herein are photovoltaic thin films comprising a tin alloy of formula (I) $Sn_{1-x}(R)_xS$ (I), wherein R is selected from magnesium (Mg), calcium (Ca) and strontium (Sr); x is not zero; and the tin alloy is crystalline. In some embodiments, the crystalline form of the tin alloy is selected from orthorhombic and rock salt. In some embodiments, the crystalline form of the tin alloy is rock salt. In some embodiments, R is selected from Ca and Sr.

Also disclosed herein are photovoltaic thin films comprising a tin alloy of formula (I) $Sn_{1-x}(R)_xS$ (I), wherein R is Sr, making the tin alloy of formula 1 $Sn_{1-x}Sr_xS$; x is not zero; and the tin alloy is in a rock salt crystalline form. In some embodiments, x is selected from 0.2, 0.25 and 0.3.

Also disclosed herein are photovoltaic thin films comprising a tin alloy of formula (I) $Sn_{1-x}(R)_xS$ (I), wherein R is Ca, making the tin alloy of formula 1 $Sn_{1-x}Ca_xS$; x is not zero; and the tin alloy is in a rock salt crystalline form. In some embodiments, the thin film displays an optical band gap of about 1.1-1.3 eV. In some embodiments, x is selected from 0.2, 0.25 and 0.3.

In any of the foregoing embodiments, the disclosed thin films can have a thickness of about 100 nm-150 μm.

In a second aspect, disclosed herein are photovoltaic devices comprising an absorber layer comprising a tin alloy of formula (I): $Sn1-x(R)xS$ (I); and a buffer layer comprising a cadmium alloy of formula (II): $Cd1-y(R1)yS$ (II); wherein: R and R1 are independently selected from magnesium (Mg), calcium (Ca) and strontium (Sr); x and y are not zero; the alloys of formulae (I) and (II) are crystalline; and the buffer layer is lattice matched with the absorber layer.

In some embodiments, the crystalline form of the tin alloy of formula (I) and the crystalline form of the cadmium alloy of formula (II) are both rock salt.

In some embodiments, R and R1 are independently selected from Ca and Sr. In some embodiments, R and R1 are both Ca; in other embodiments, R and R1 are both Sr.

In some embodiments, x and y have the same value.

In embodiments where R and R1 are both Ca, the ratio of tin:calcium and the ratio of cadmium:calcium is selected from: about 0.80:0.20 to about 0.20:0.80; about 0.70:0.30 to about 0.45:0.55; and about 0.75:0.25 to about 0.50:0.50.

In embodiments where R and R1 are both Sr, the ratio of tin:strontium and the ratio of cadmium:strontium is selected from about 0.80:0.20 to about 0.20:0.80; about 0.70:0.30 to about 0.45:0.55; and 0.75:0.25 to about 0.50:0.50.

In some embodiments, the absorber layer displays a band gap energy of 0.6-1.5 eV. In some embodiments, the absorber layer has a thickness between about 100 nm and 150 μm.

In a third aspect, disclosed herein are inorganic photovoltaic devices comprising a substrate; an absorber layer comprising a first chalcogenide; and a buffer layer comprising a second chalcogenide, wherein the buffer layer is lattice matched with the absorber layer.

In some embodiments, the absorber layer comprises a solid state chalcogenide alloy of tin sulfide and a second sulfide. In some embodiments, the second sulfide is selected from calcium sulfide or strontium sulfide.

In some embodiments, the buffer layer comprises a solid state chalcogenide alloy of cadmium sulfide and a second sulfide. In some embodiments, the second sulfide is calcium sulfide or strontium sulfide.

In some embodiments, the absorber layer comprises a solid state chalcogenide alloy of tin sulfide and a first selenium-containing compound, sulfur-selenium mixture or any combination thereof.

In some embodiments, the buffer layer comprises a solid state chalcogenide alloy of cadmium sulfide and a second selenium-containing compound, sulfur-selenium mixture or any combination thereof.

In some embodiments, the absorber layer comprises a solid state chalcogenide alloy of tin selenium and a second selenium. In some embodiments, the second selenium is calcium selenium or strontium selenium.

In some embodiments, the buffer layer comprises a solid state alloy of cadmium selenium and a second selenium. In some embodiments, the second selenium is calcium selenium or strontium selenium.

In some embodiments, the device displays a band gap energy between 0.6 and 1.5 eV.

Also disclosed herein are inorganic photovoltaic devices comprising a substrate; an absorber layer comprising a first chalcogenide; a buffer layer comprising a second chalcogenide; and a transparent conductor; wherein the buffer layer is lattice matched with the absorber layer. In some embodiments, the transparent conductor is selected from a group of conducting oxides consisting of indium oxide, zinc oxide, cadmium oxide, tin oxide and combinations thereof. In some embodiments, the transparent conductor is a doped inorganic metal oxide.

In some embodiments, the substrate is selected from a group consisting of polyesters, polyvinyl acetals, polyamides, polycarbonates and polyurethanes. In some embodiments, the substrate is selected from glass, ceramic, plastic, a silicon wafer, a photovoltaic cell and a semiconductor.

In a fourth aspect, disclosed herein is a method of forming an inorganic photovoltaic device, comprising: depositing an absorber layer onto a substrate, wherein the absorber layer contains a first chalcogenide; depositing a buffer layer onto the absorber layer, wherein the buffer layer contains a second chalcogenide and is lattice matched with the absorber layer.

In some embodiments, the device comprises a substrate and a transparent conductor, wherein the transparent conductor is selected from a group of conducting oxides consisting of indium oxide, zinc oxide, cadmium oxide, tin oxide and combinations thereof. In some embodiments, the transparent conductor is a doped inorganic metal oxide.

In some embodiments, the substrate is selected from a group consisting of polyesters, polyvinyl acetals, polyamides, polycarbonates and polyurethanes. In other embodiments, the substrate is selected from glass, ceramic, plastic, a silicon wafer, a photovoltaic cell and a semiconductor.

In some embodiments, the absorber layer is deposited on the substrate by a deposition method selected from a group consisting of slot-die coating, spin-casting, drop-casting, dip-coating, knife coating (also known as doctor blading), spray-coating, ink jet printing, screen printing, Mayer rod coating (also known as metering rod coating), Gravure coating, Flexo printing, and curtain coating.

In a fifth aspect, disclosed herein are compositions comprising: a solid state alloy between tin sulfide (SnS) and a second sulfide, the second sulfide selected from calcium sulfide (CaS) and strontium sulfide (SrS); wherein the ratio of SnS to either CaS or SrS varies between 75/25 and 50/50 parts of SnS/CaS or SnS/SrS.

In some embodiments, the composition has a band gap energy between 0.6 and 1.5 eV. In some embodiments, the composition is integrated in a photovoltaic device.

Also disclosed herein are compositions comprising: a solid state alloy between cadmium sulfide (CdS) and a second sulfide, the second sulfide selected from calcium sulfide (CaS) and strontium sulfide (SrS); wherein the ratio of CdS to either CaS or SrS varies between 5/95 and 50/50 parts of CdS/CaS or CdS/SrS.

In some embodiments, the composition has a band gap larger than that of pure CdS (2.5 eV). In some embodiments, the composition is integrated in a photovoltaic device as a contact to the photovoltaic absorber material.

Also disclosed herein are compositions comprising: a solid state alloy between tin selenium and a second selenium, the second selenium selected from calcium selenium and strontium selenium; wherein the ratio of tin selenium and either calcium selenium or strontium selenium varies between 75/25 and 50/50 parts.

Also disclosed herein are compositions comprising: a solid state alloy between cadmium selenium and a second selenium, the second selenium selected from calcium selenium and strontium selenium; wherein the ratio of cadmium selenium to either calcium selenium or strontium selenium varies between 5/95 and 50/50 parts.

In addition to the exemplary aspects and embodiments described above, further aspects and embodiments will become apparent by reference to the drawings and by study of the following descriptions.

BRIEF DESCRIPTION OF THE DRAWINGS

Various embodiments are illustrated in referenced figures of the drawings. It is intended that the embodiments and figures disclosed herein are to be considered illustrative rather than limiting. Those skilled in the art will understand that the drawings, described herein, are for illustration purposes only. The drawings are not intended to limit the scope of the present disclosure.

(FIG. 7a) TEM image; (FIG. 7b) and (FIG. 7c) diffraction patterns of along the <001> and <011> zone axes, respectively; (FIG. 7d) Glancing incidence X-ray diffraction (asterisks denote substrate reflections); (FIG. 7e) The lattice parameter as a function of Ca content x. The dashed line is a linear interpolation between the calculated (DFT) and measured (literature) lattice parameters of the binary rs-SnS and CaS compounds.

DETAILED DESCRIPTION

Figure 1:
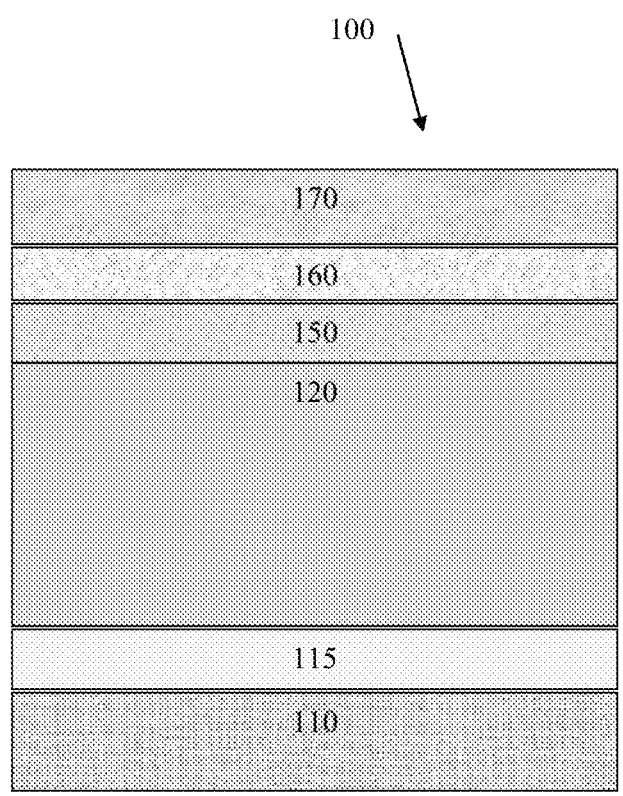
FIG. 1 illustrates, in simplified form, a photovoltaic device.

Reference is now made in detail to certain embodiments of the disclosed devices, methods, systems, and processes. The disclosed embodiments are not intended to be limiting of the claims. To the contrary, the claims are intended to cover all alternatives, modifications, and equivalents.

Disclosed herein are thin-film materials generated by the stabilization of the rock salt phase of SnS by alloying with the various sulfides, and methods of producing the same. In some embodiments, MgS, CaS, and SrS, may be used to aid in stabilizing the structure of SnS. In some embodiments, the selected sulfide assumes the rock salt (rs) structure as the ground state and aids in maintaining the absorber layer in a rock salt structure. In many embodiments, the disclosed alloys aid in reducing the indirect bandgap of tin sulfide. The materials disclosed herein may be useful, in several aspects, in the generation of PV cells.

Also described herein are ab initio calculations performed for the alloy mixing enthalpy in either the orth or rs structure, as well as for the band-structure and optical properties of the rs alloys. In some embodiments, a low mixing enthalpy and a high absorption close to the band gap energy are predicted for alloys with CaS and SrS. Experimentally, $Sn_{1-x}Ca_xS$ alloys were synthesized by pulsed laser deposition (PLD). The formation of the isotropic rs structure was confirmed, as well as measured optical band gaps in the range of interest for PV applications, i.e., 1.1-1.3 eV.

The disclosed calculations, syntheses, and characterizations of the disclosed $Sn_{1-x}Ca_xS$, $Sn_{1-x}Sr_xS$, and $Sn_{1-x}Mg_xS$ alloys demonstrate that the functional properties of photovoltaic materials may be modified. Here, the disclosed alloying process and materials induce structural modifications of the crystal structures.

In various aspects, an inorganic photovoltaic device is described herein. In some embodiments, the device comprises a substrate, an absorber layer comprising a first chalcogenide and a buffer layer comprising a second chalcogenide, wherein the buffer layer is lattice matched with the absorber layer. This buffer layer has a wide band gap maintaining optical transparency and has a suitable conduction band offset with the above absorber material. In many embodiments, a chalcogenide may refer to a chemical compound consisting of at least one chalcogen anion and at least one more electropositive (electron donating) element, the chalcogen being one of the chemical elements in group 16 of the periodic table (oxygen (O), sulfur (S), selenium (Se), tellurium (Te) and polonium (Po)).

Chalcogenide-based compounds that can be used for the absorber layer and buffer layer may include any chemical compound consisting of at least one chalcogen ion and at least one more electropositive, or electron donating, element. In some embodiments, chalcogens include solid state alloys of sulfides, selenides, tellurides and combinations thereof. Absorber layers may include a first chalcogenide such as tin sulfide, cadmium sulfide, calcium sulfide, strontium sulfide, or any combination thereof. Buffer layers may include a second chalcogenide such as tin sulfide, cadmium sulfide, calcium sulfide, strontium sulfide, or any combination thereof. In some embodiments, a thin-film absorber layer may be formed by alloying SnS with CaS or with SrS. In some embodiments, a buffer layer may be formed by alloying CdS with CaS or SrS. Also disclosed are methods of alloying CaS or SrS into both the SnS absorber and into the CdS buffer. Additional embodiments of the disclosed absorber layer or buffer layer may be obtained by alloying the first or second chalcogenide with a selenium-containing compound, a sulfur-selenium mixture or any combination thereof.

In various aspects, the disclosed thin film PV semiconductor materials are obtained by alloying tin sulfide (SnS) and/or cadmium sulfide (CdS) with a second sulfide, which can be either calcium sulfide (CaS), strontium sulfide (SrS), or any other chalcogenide. Tin sulfide and cadmium sulfide can also be alloyed with a selenium-containing compound, a sulfur-selenium mixture, or a combination thereof. Additional embodiments may be obtained by alloying tin and/or cadmium with a selenium-containing compound, a sulfur-selenium mixture, or a combination thereof.

Figure 5:
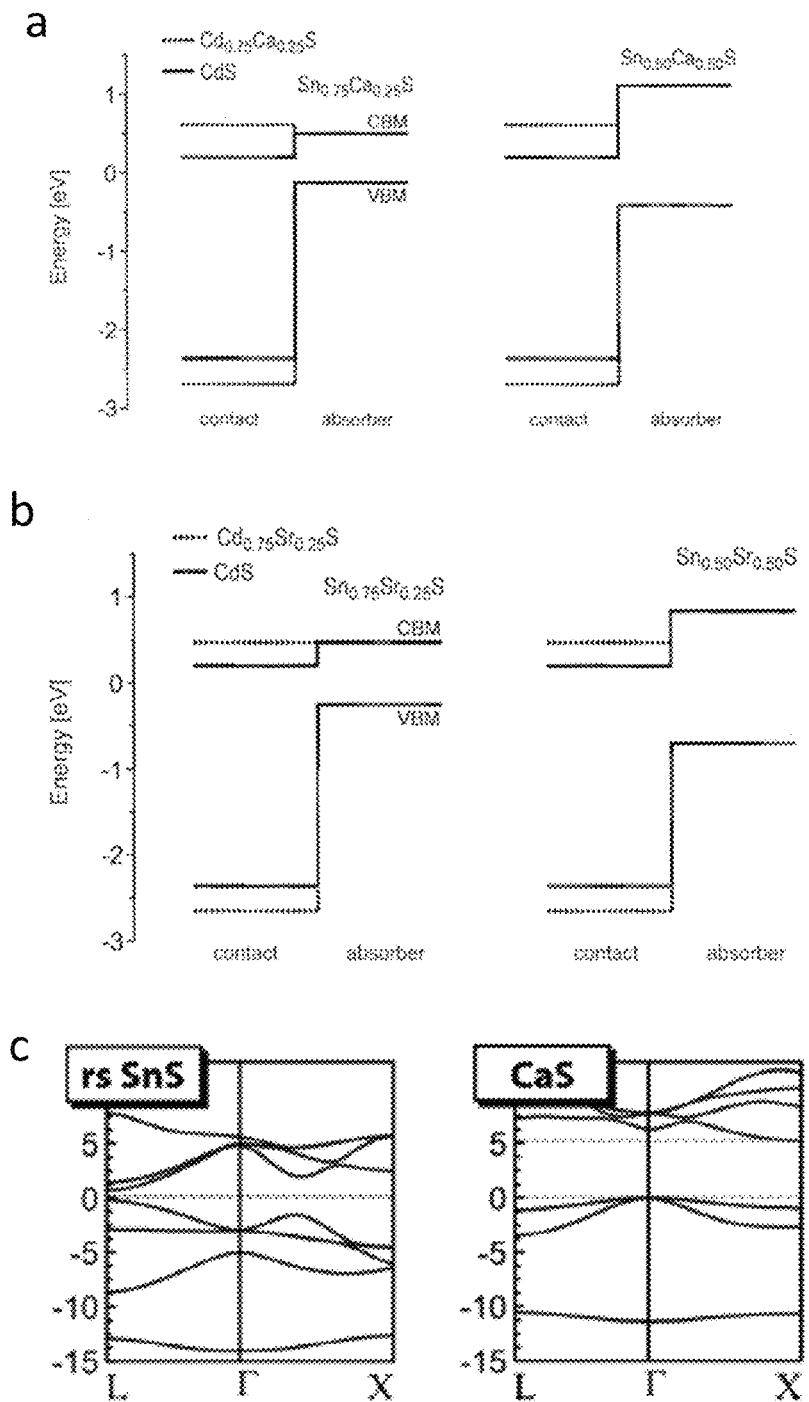
FIGS. 5a and 5b are graphs illustrating the calculated band offset.
FIG. 5c depicts band structures of the cubic rs structure of the binary SnS and CaS compounds.

Alloying as described above has two beneficial effects: First, the band gap is increased, leading to a better transparency of the front contact and fewer losses due to absorption of high energy photons in the contact material. Second, the band-offset with the $Sn_{1-x}Ca_xS$ and $Sn_{1-x}Sr_xS$ absorber materials is reduced as seen in FIGS. 5a and 5b, showing the Ca/Sr compositions in the absorber and in the contact material are equal, i.e., x=y=0.25.

FIG. 1 illustrates one embodiment of a photovoltaic structure 100 provided by the present disclosure having a substrate 110 and a back contact layer 115 deposited onto the substrate 110. An absorber layer 120 is grown and deposited onto the back contact layer 115. A thin buffer layer 150 is deposited onto the absorber layer 120. The buffer layer 150 is overlaid with a thin intrinsic ZnO layer 160. A transparent conducting layer 170 is deposited onto the ZnO layer 160. In some embodiments, the absorber layer 120 comprises a tin sulfide that is alloyed with calcium sulfide, strontium sulfide or any other combination of chalcogenides, in the manner disclosed herein. In some embodiments, the buffer layer 150 comprises cadmium sulfide which is lattice matched with the absorber layer 120 and is alloyed with calcium sulfide, strontium sulfide or any other combination of chalcogenides in the same manner as the tin sulfide, disclosed herein. In some embodiments the substrate 110 may comprise glass, chromium, molybdenum, silicon, silicon dioxide, aluminum oxide, sapphire, germanium, an alloy of silicon and germanium, indium phosphide (InP), glass coated with a Molybdenum film 115, or any combination thereof.

Figure 6:
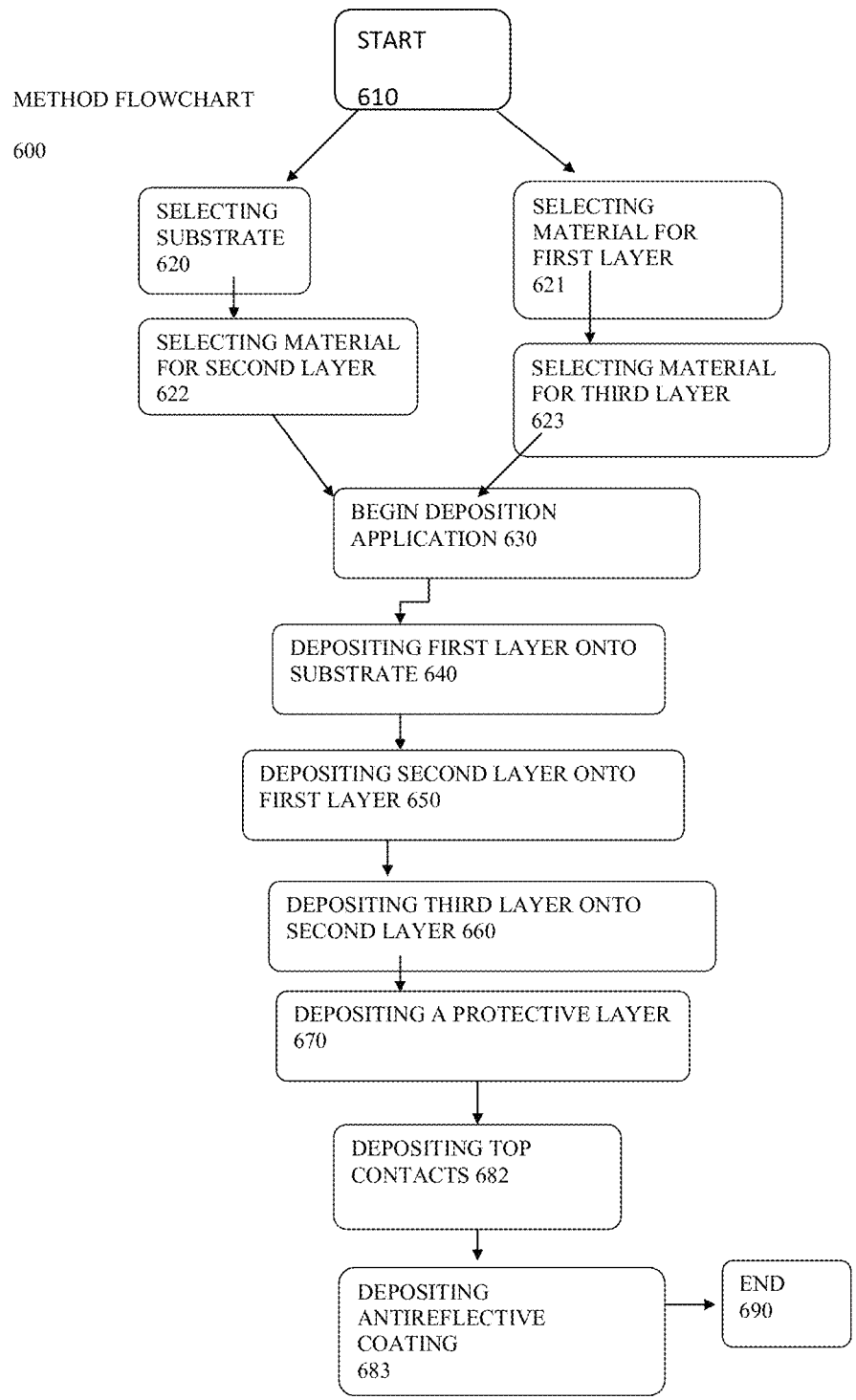
FIG. 6 is a flowchart of a sample embodiment of a method of forming a SnS based absorber material thin film.

FIG. 6 illustrates one method 600 for fabricating an electrochemical device. In some embodiments, the electrochemical device comprises one or more layers, such as an absorber layer, made of a $Sn_{1-x}Ca_xS$, $Sn_{1-x}Sr_xS$, or $Sn_{1-x}Mg_xS$ alloy as disclosed herein. The method 600 begins at 610 such as by designing of a particular device to be fabricated such as lithium-ion battery or the like. The method 600 continues with selecting material for the substrate 620, buffer layer 621, absorber layer 622, and optional third layer 623. At 630, the method 600 may include the deposition application of the three layers. Embodiments of absorber layers may include a first chalcogenide such as tin sulfide, cadmium sulfide, calcium sulfide, strontium sulfide, or any combination thereof. Embodiments of buffer layers may include a second chalcogenide such as tin sulfide, cadmium sulfide, calcium sulfide, strontium sulfide, or any combination thereof. The absorber layer may be formed by alloying SnS with CaS or with SrS. Some embodiments may include a buffer layer formed by alloying CdS with CaS or SrS. Various embodiments may include a method of alloying CaS or SrS into both the SnS absorber and into the CdS buffer. In other embodiments, the absorber layer or buffer layer may be obtained by alloying the first or second chalcogenide with a selenium-containing compound, a sulfur-selenium mixture or any combination thereof.

In some embodiments, the thickness of the absorber layer of a thin film photovoltaic cell provided by the present disclosure may be from about 10 nm to about 200 μm, or larger than about 10 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, or 190 nm, and less than about 200 nm, 190 nm, 180 nm, 170 nm, 160 nm, 150 nm, 140 nm, 130 nm, 120 nm, 110 nm, 100 nm, 90 nm, 80 nm, 70 nm, 60 nm, 50 nm, 40 nm, 30 nm, or 20 nm. In some embodiments, a photovoltaic cell comprises a single absorber layer. In some embodiments, a photovoltaic cell comprises two absorber layers. In some embodiments, a photovoltaic cell comprises multiple absorber layers or more than two absorber layers.

The method 600 continues with depositing the buffer layer onto the substrate 640, followed by depositing the absorber layer onto the buffer layer 660 and depositing the third layer onto the absorber layer 660. The device is completed by depositing a protective layer 670 to protect the absorber and third layers from sputtering damage, followed by depositing top contacts 682 and depositing an antireflective coating 683. The method 600 then may end at 690. Various deposition techniques may be used to generate the electrochemical devices provided by the present disclosure including, without limitation, slot-die coating, spin-casting, drop-casting, dip-coating, knife coating, doctor blading, spray-coating, ink-jet printing, screen printing, Mayer rod coating, metering rod coating, Gravure coating, Flexo printing, curtain coating, or combinations of any of the foregoing.

Figure 2:
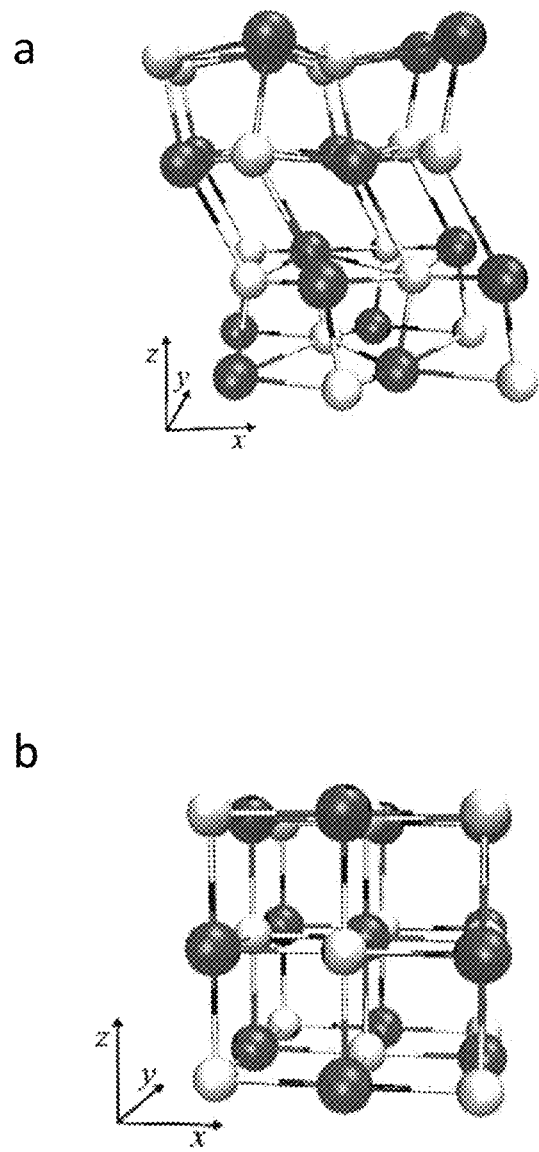
FIGS. 2a and 2b illustrate the crystal structures of SnS in its orthorhombic ground state (FIG. 2A) and in a rock-salt crystalline structure (FIG. 2B). Cations are depicted as dark balls and anions as white balls.

The conduction band offset between CdS and SnS in its normal orthorhombic phase is undesirably large. As a result of the alloying disclosed herein, the SnS absorber assumes a different crystal structure. The band gap of about 1.1 eV of SnS in its ground state (orthorhombic crystal structure, one embodiment of which, space group 62, is as shown in FIG. 2a), is indirect, and the absorption threshold in thin-films at 1.5 eV lies significantly higher, causing a considerable loss of photocurrent. The layered crystal structure causes anisotropic effective masses for electrons and holes, hindering the transport of photo-excited carriers in the direction perpendicular to the layers. In addition, the common buffer material CdS at the front contact exhibits an unfavorable conduction-band offset with SnS, i.e., the conduction band minimum (CBM) of CdS lies well below that of SnS, which causes a reduction of the open circuit voltage compared to the SnS band gap. In contrast, the new alloy material disclosed herein, $Sn_{1-x}Ca_xS$, $Sn_{1-x}Sr_xS$, or $Sn_{1-x}Mg_xS$, has a rock-salt crystal structure (one embodiment of a rock salt structure, space group 225, is as shown in FIG. 2b), which, as shown in FIG. 2, is different from the crystal structure of pure SnS and more conducive to the transport of photo-excited carriers. This new material has a tunable band gap suitable for a photovoltaic absorber and has a strong optical absorption at photon energies close above the band gap energies.

The properties of these new materials can be calculated via the methods provided in the Examples and/or by using electronic structure methods based on density functional theory (DFT) and many-body perturbation theory within the GW approximation. These calculations provide the crystal structure, the band gap energy and the optical properties (absorption spectrum) for the new material obtained by alloying SnS. Further calculations provide the band-offsets of these materials with the new materials obtained by alloying CdS.

FIGS. 3a, 3b, and 3c show the formation energy of the alloys $Sn_{1-x}Ca_xS$ and $Sn_{1-x}SrS$ and $Sn_{1-x}Mg_xS$ alloys, respectively, as a function of the composition. The formation energies can be determined from DFT calculations of large supercells (more than 200 atoms) for many individual random alloy configurations. For compositions above approximately $x_{Ca}$=0.18 or $x_{Sr}$=0.28, the formation energy of the alloy is reduced when the alloy assumes the rock-salt structure (ground-state structure of CaS and SrS) instead of the orthorhombic structure (ground-state structure of SnS).

Figure 4:
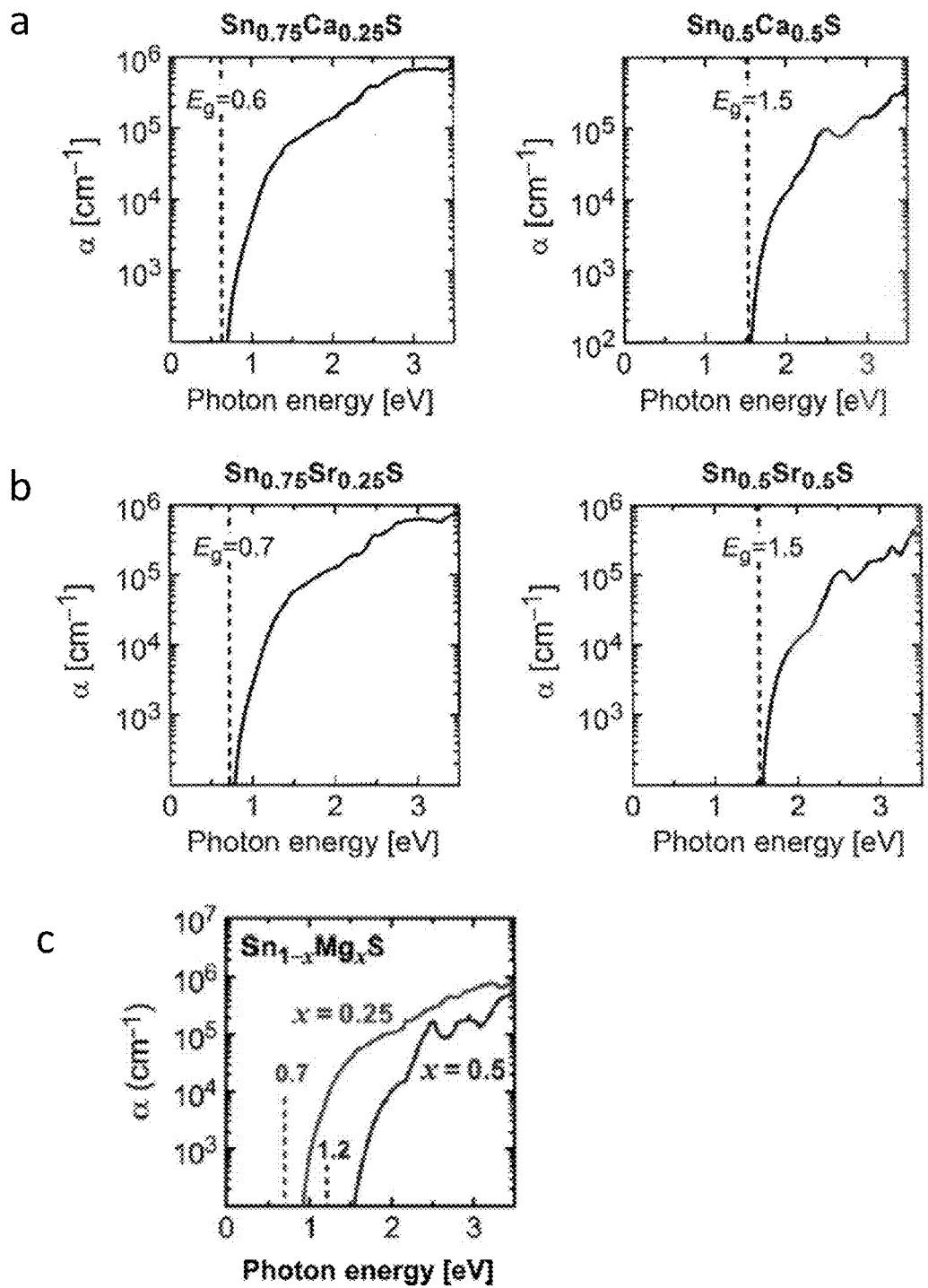
FIGS. 4a, 4b, and 4c are graphs illustrating the calculated bandgap and absorption coefficients.

The band-structure and optical properties of the rock-salt crystalline structure alloys can be investigated, for example, by conducting GW approximation calculations for two compositions, x=0.25 and x=0.50. Since such GW calculations are computationally very demanding, these calculations can be performed for small 16-atom cells using the so-called special quasi-random structures (SQS) as a model for the random alloy. As shown in FIG. 4a, the band gap of the $Sn_{1-x}Ca_xS$ alloy increases from $E_g$=0.6 eV for x=0.25 to $E_g$=1.5 eV for x=0.50. As shown in FIG. 4b, the band gap of the $Sn_{1-x}Sr_xS$ alloy increases from $E_g$=0.7 eV for x=0.25 to $E_g$=1.5 eV for x=0.50. For both the Ca and Sr containing alloys, the range of achievable band gaps between x=0.25 and x=0.50 covers the range for photovoltaic absorbers in a single-junction solar cell design. In many embodiments, the amount of strontium or calcium in the absorber layer can vary. Regarding the formula $Sn_{1-x}(Ca \text{ or } Sr)_xS$, x can vary from about 0.18 and 0.60, and thus the ratio of tin to calcium or tin to strontium (Sn:Ca or Sn:Sr) can vary from about 0.82:0.18 to about 0.40:0.60.

The absorption coefficient α, is shown in FIGS. 4a and 4b as a function of the photon energy. Alpha can be calculated for direct and dipole-allowed optical transitions within the independent particle approximation (excitonic effects further increase α by up to about one order of magnitude). For optimal solar cell performance, it is desirable to have a strong absorption at energies close above the band gap energy, because any offset between $E_g$ and the absorption onset results in a reduced absorption of incident solar photons and, hence, in a reduced photocurrent without a corresponding gain in voltage. As seen in FIGS. 4a and 4b, the spectra for the $Sn_{1-x}Ca_xS$ and $Sn_{1-x}Sr_xS$ alloys disclosed herein show a steep onset of optical absorption just above the band gap energy. This result represents a considerable improvement over pure SnS, where similar calculations reveal an offset of about 0.4 eV between the indirect band gap and the onset of direct-allowed transitions. These data indicate that the $Sn_{1-x}Ca_xS$ and $Sn_{1-x}Sr_xS$ alloys can be used in PV technologies and are likely to produce optimal performance in a solar cell.

The conduction band offset between CdS with $Sn_{1-x}Ca_xS$ and $Sn_{1-x}Sr_xS$ can also be evaluated for the two compositions x=0.25 and x=0.50. For this purpose, a slab supercell can be constructed to accommodate the interface between CdS and SnS. The band-offsets can be determined by combining the results of computational quantum mechanical modelling, such as a density functional theory (DFT) calculation, of the slab yielding the potential step at the interface, and a GW quasiparticle energy approximation, yielding the band edge energies relative to the respective potentials. The variation of the band edge energies and the ensuing variation of the band offsets can be determined from a GW approximation of alloy models, using a potential alignment technique. As shown in FIGS. 5a and 5b, the conduction band minimum of CdS lies significantly below that of $Sn_{1-x}Ca_xS$ and $Sn_{1-x}Sr_xS$, leading to an undesirable conduction band offset. However, when the CdS buffer is alloyed in the same manner disclosed herein for SnS, for example as $Cd_{1-x}Ca_xS$ or $Cd_{1-x}Sr_xS$ at a similar composition of x as the SnS-based absorber, a vanishing band offset is achieved.

In other embodiments, a composition integrated in a PV device as a contact to the PV absorber material, as described above, can comprise a solid state alloy between tin sulfide (SnS) and a second sulfide, which can be either calcium sulfide (CaS) or strontium sulfide (SrS). The composition ratio can vary between 75/25 and 50/50 parts of SnS/CaS or SnS/SrS. In some embodiments, the composition can exhibit the rock-salt crystalline structure and may exhibit a band gap energy between 0.6 and 1.5 eV. In some embodiments, the composition can also comprise a solid state alloy between cadmium sulfide (CdS) and a second sulfide selected from calcium sulfide (CaS) and strontium sulfide (SrS). The composition ratio can vary between 5/95 and 50/50 parts of CdS/CaS or CdS/SrS. In some embodiments, the composition can exhibit a wurtzite or zinc-blende crystalline structure and may exhibit a band gap larger than that of pure CdS (2.5 eV). In some embodiments, the composition comprises a solid state alloy between tin selenium and a second selenium selected from calcium selenium and strontium selenium. The composition ratio can vary between 75/25 and 50/50 parts of tin selenium/calcium selenium or tin selenium/strontium selenium. In some embodiments, the composition comprises a solid state alloy between cadmium selenium and a second selenium selected from calcium selenium and strontium selenium. The composition ratio can vary between 5/95 and 50/50 parts of cadmium selenium/calcium selenium or cadmium selenium/strontium selenium.

EXAMPLES

It is noted that there are alternative ways of implementing the embodiments disclosed herein. While a number of exemplary aspects and embodiments are disclosed, those of skill in the art will recognize certain modifications, permutations, additions and sub combinations thereof. Accordingly, the disclosed embodiments are to be considered as illustrative and not restrictive.

Materials and Methods

The work disclosed in the following Examples was performed at the National Renewable Energy Laboratory (Golden, Colo.) and in the Departments of Physics and Chemistry at Oregon State University (Corvallis, Oreg.).

Pulsed laser deposition (PLD) targets were prepared from mixtures of CaS and Sn metal, with tin to calcium ratios of 2.33:1 and 1:1 (0.70:0.30 and 0.50:0.50), which were annealed under flowing $H_2S$ for 4 h at 400° C. In the case of the 1:1 target, the resulting powder was ground, pressed, and then annealed for a further 2 h at 400° C. under flowing $H_2S$. The 2.33:1 target had approximately 20% excess sulfur added prior to being pressed and annealed in a hot isostatic press (AIP HP630) under Ar. A 248-nm KrF pulsed excimer laser was used for the ablation of the targets. The target-substrate separation was fixed at 5.4 cm. The substrate temperature was varied from 300 to 600° C. with a laser fluence of 1.0 J/cm$^2$ and pulse rate of 7 Hz. All films were deposited in a vacuum, with a base pressure of $10^{-9}$ Torr. Following deposition, films were cooled rapidly in a vacuum.

Glancing incidence x-ray diffraction for phase identification purposes was performed using a Rigaku RAPID diffractometer with an incidence angle of 10°. For lattice parameter measurements, θ-2θ x-ray diffraction patterns were obtained using a Bruker D8 Discover x-ray diffractometer and a Rigaku Ultima IV diffractometer in the parallel beam geometry with Cu $K_\alpha$ radiation. The (200) reflection at $2\theta_{200}=32.96°$ from the Si substrate was used to calibrate the spectrum. Background subtraction using a polynomial fit was performed, and peaks were fit to a Lorenztian profile to determine the peak positions. Cross sectional imaging and electron diffraction data were obtained using an FEI Titan transmission electron microscope at accelerating voltages of 80 and 200 kV. The samples were rotated to alter the crystallographic direction being measured, and the diffraction from the silicon substrate was used to calibrate the patterns.

The chemical composition of the films was determined by measuring the $K_\alpha$ emission from sulfur, oxygen, silicon, and calcium, and the $L\alpha$ emission from tin using a Cameca SX 50 electron microprobe at accelerating voltages of 10, 15, and 20 kV. Energy dispersive x-ray spectroscopy was used for stoichiometry measurements of transmission electron microscopy (TEM) samples.

Optical transmission and reflection data were collected using a custom-made spectrometer with a double grating monochromator. Measurements in the ultraviolet and visible regions were performed using a xenon lamp and silicon detector. A tungsten lamp and InGaAs detector were used for near infrared measurements. The absorption coefficient α was calculated using $T/(1-R)=e^{-\alpha d}$, where T is transmission, R is reflection, and d is the film thickness, which was determined using a J.A. Woolam V-VASE spectroscopic ellipsometer. Resistivity and Hall measurements were performed using a LakeShore Cryotronics 7504 Hall effect measurement system at magnetic fields up to 2 T. Electrical contacts were made using pressed indium. Room temperature Seebeck coefficients were measured relative to copper using a custom-built system with a maximum temperature differential across the sample of 5K.

Ab initio calculations were performed using the Vienna Ab-initio Simulation (VASP) package. To compute mixing enthalpy of alloys, density functional theory-generalized gradient approximation (DFT-GGA) total-energy calculations were performed in large supercells of more than 200 atoms. For both the orthorhombic (orth) and the rock salt (rs) crystalline structures, alloy concentration was sampled by considering several individual random alloy configurations for a given concentration while relaxing both volume and internal coordinates. Band gaps and optical properties were determined from quasiparticle energy calculations within the GW approximation using a fully relaxed 16-atom Special Quasirandom Structure (SQS) to simulate the random alloy. The optical spectra were determined from the macroscopic polarizability in the independent particle approximation.

Example 1

Alloy Energetics, Structure, and Stability

Figure 3:
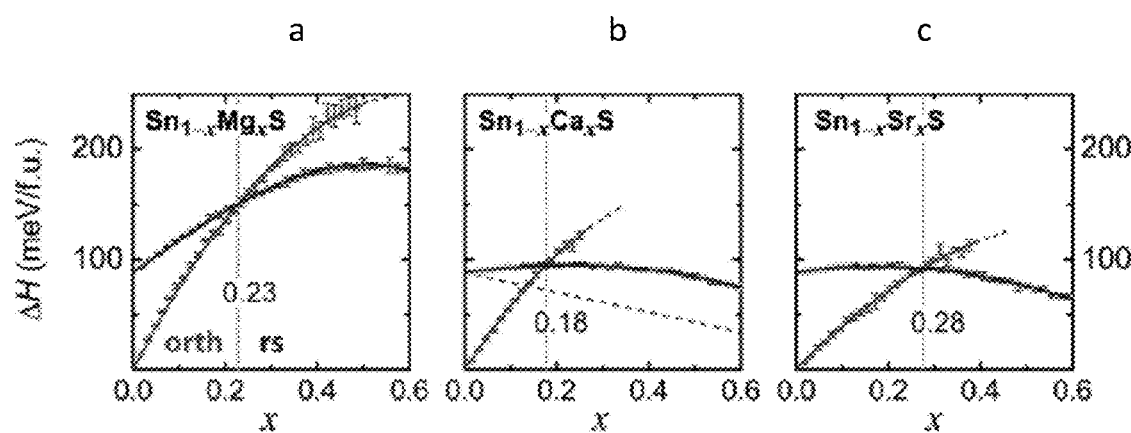
FIGS. 3a, 3b, and 3c are graphs illustrating the calculated formation enthalpies of SnS/MgS, SnS/CaS, and SnS/SrS alloys, respectively. The graphs also show the transition from orthorhombic (orth) to rock salt (rs) as the structure with the lowest enthalpy at composition values between $0.18<x<0.28$. The dashed line shown for the Ca alloy is a guide to illustrate the mixing enthalpy relative to the rs phases of SnS and CaS.

The transition from the orthorhombic structure of SnS into the cubic rs structure was explored by calculating the mixing enthalpy between SnS and three group-II sulfides MgS, CaS, and SrS. The disclosed sulfides have the rs phase as the ground state structure. As shown in FIG. 3, the enthalpy of the rs structure becomes lower than that of the orth structure at compositions of xMg=0.23, xCa=0.18, or xSr=0.28, indicating that alloy compositions above these values would occur in the cubic phase. The mixing enthalpies of the Ca and Sr alloys are lower than that of the Mg alloy, which is due to the larger lattice mismatch between MgS and SnS. In the cubic rs phase, the calculated lattice constants are 5.22, 5.71, 6.07, and 5.84 Angstroms for MgS, CaS, SrS, and SnS, respectively. Note that within the DFT-GGA approximation used, lattice constants are generally overestimated by about 1%-2%, compared to experiment.

The mixing enthalpies of the order of 100 meV for the $Sn_{1-x}Ca_xS$ and $Sn_{1-x}Sr_xS$ alloys (see FIG. 3) indicate that there is a miscibility gap under thermodynamic equilibrium conditions, similar to the case of, e.g., the well-studied $Ga_{1-x}In_xN$ alloys. However, it is also well established that such III-V alloys can be grown over the full composition range, aided by non-equilibrium conditions at lower growth temperatures around 600° C. In contrast to these III-V systems where the alloy components have the same crystallographic phase, the miscibility gap occurs in the present SnS alloys between two different crystallographic phases, suggesting that there exist additional barriers for phase separation that arise due to the surface energy associated with the nucleation of a phase with a different structures. Therefore, once the alloy assumes the rs structure above the identified composition, a possible phase separation might be expected to proceed within the rs structure until sufficiently large Sn-rich regions are formed that are able to overcome the nucleation energy for the precipitation of the orth structure. As illustrated in FIG. 3 for the case of Ca alloying, the mixing enthalpy with respect to the binary end compounds in their rs structure is smaller than that with respect to the binary end compounds in their ground state structures. It can be described by an alloy interaction parameter $\Omega$=162 meV within the second order approximation $\Delta H=\Omega x(1-x)$ which is considerably smaller than $\Omega \approx 260$ meV for $Ga_{1-x}In_xN$ alloys. Thus, within the constraint given by the structural framework of the rs structure, the driving force for phase separation, e.g., via spinodal decomposition, is not very strong, and the growth of rs structure alloys between SnS and CaS or SrS seems to be sufficiently feasible to attempt thin film growth experiments.

Example 2

Synthesis of $Sn_{1-x}Ca_xS$ Alloys

Thin films of $Sn_{1-x}Ca_xS$ were prepared by PLD on amorphous $SiO_2$ and <001>-oriented single crystal Si with a 100-nm thermal oxide layer at substrate temperatures between 300 and 600° C. Electron probe microanalysis and energy dispersive X ray spectroscopy indicate that films grown at 300 and 400° C. have about 10% higher calcium content than that of the PLD target. At 500° C. and above, there is a considerable loss of Sn, leading to high Ca compositions, while still preserving a nearly one-to-one cation-to-anion ratio. The films did not show any measurable oxygen content. The $Sn_{1-x}Ca_xS$ films were typically 100-150 nm thick. The Ca content was 0.39<x<0.91; films with lower x could not be made from the available (Ca,Sn)S targets. Reduction of x was attempted by producing alternating (Ca,Sn)S and SnS layers deposited from alloy and pure SnS targets, respectively, and annealing the film to mix the layers. SnS films were also produced from SnS targets (no Ca) under similar conditions and with similar thickness.

Figure 7:
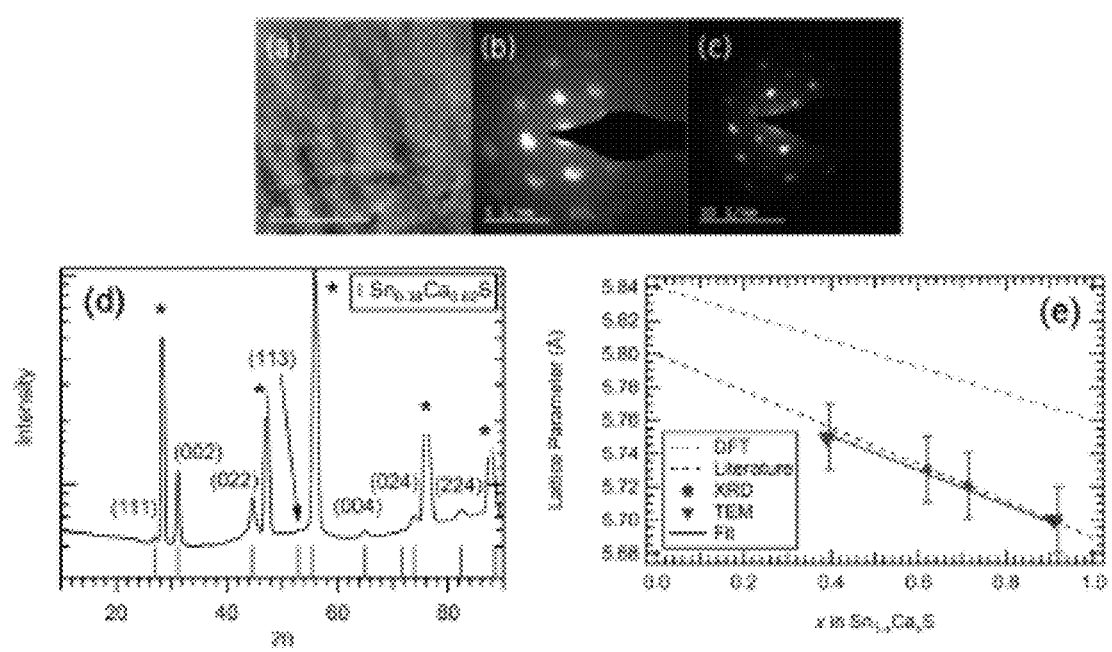
FIGS. 7a-e show results from structural characterization of $Sn_{1-x}Ca_xS$ thin films.

As shown in FIG. 7, the films appear dense and well crystallized in TEM. The diffraction patterns from observations along <011> and <111> zone axes are consistent with the cubic rock salt structure and do not generally correlate with patterns from the orthorhombic SnS structure. Thus, the X-ray diffraction of the $Sn_{1-x}Ca_xS$ films confirms that all measured films adopt the cubic rock salt structure. Glancing incidence x-ray measurements on a film with composition $Sn_{0.38}Ca_{0.62}S$ are shown in FIG. 3 as an example. The reflections with positions and intensities are consistent with the cubic rock salt structure (FIG. 7 and Table I). Reflections from orthorhombic SnS are not present in the measured spectrum. Similar growths of orthorhombic SnS on silicon generally result in oriented films with the (0k0) peaks predominating the x-ray diffraction pattern, and these were not observed in these $Sn_{1-x}Ca_xS$ films. The (002) and (022) reflections from the cubic $Sn_{1-x}Ca_xS$ are readily observed and were used to determine the lattice parameter of the films, which decreases as the calcium content is increased, i.e., from 0.575 nm for x=0.4 to 0.569 nm for x=0.92 (FIG. 2). The lattice parameters were determined from the TEM for two film compositions, x=0.39 and x=0.91, and were consistent with the lattice parameters measured by X-ray diffraction (see FIG. 7e). The linear trend of the measured lattice parameter indicated by the fit line in FIG. 7e suggests that the $Sn_{1-x}Ca_xS$ films may form a generally homogeneous solid solution. The linear interpolation of the experimental literature values for rs-SnS (a=0.580 nm) and CaS (a=0.5689 nm) describes very well the present data for the composition dependence in the alloy. The density functional theory (DFT) calculated lattice parameters show a similar relative change between rs-SnS and CaS, the overestimation of the absolute values by about 1% is typical for the generalized gradient approximation.

TABLE I shows calculated peak positions and intensities for cubic $Sn_{0.38}Ca_{0.62}S$ (a=0.573 nm). The intensities for (SnCa)S are weighted averages of intensities of rs-SnS (ICSD-651015) and rs-CaS (ICSD-619534).

TABLE I

| $Sn_{0.38}Ca_{0.62}S$ | | |
|---|---|---|
| (hkl) | 2θ | Intensity |
| (111) | 26.93 | 0.24 |
| (002) | 31.19 | 1 |
| (022) | 44.69 | 0.68 |
| (113) | 52.95 | 0.12 |
| (222) | 55.5 | 0.23 |
| (004) | 65.05 | 0.1 |
| (133) | 71.74 | 0.05 |
| (024) | 73.91 | 0.28 |
| (224) | 82.38 | 0.21 |

The absorber layer has a rock salt structure. In many embodiments, the calculated weighted averages of the peak intensities for the disclosed absorber layer are highest for (hkl) reflections (002) and (022). In some embodiments, the average weighted peak intensities for these two positions are between about 0.50 and 1.0. In some embodiments the average weighted peak intensities for these two positions are greater than about 0.50, 0.65, 0.70, 0.75, 0.80, 0.85, 0.90, or 0.95, and less than about 1.00, 0.95, 0.90, 0.85, 0.80, 0.75, 0.70, 0.65, 0.60, or 0.55.

Band-Structure and Optical Properties of the Alloys

The optical absorption of orth SnS has been determined experimentally and theoretically. The indirect band gap of SnS lies at 1.07 eV, but the onset of optical absorption in thin films lies somewhat higher around 1.3-1.4 eV, which may be due to the indirect and anisotropic nature of the band structure. Generally, absorption in a thin film of thickness about 1 μm requires an absorption coefficient above $10^4$ cm$^{-1}$, which may occur at photon energies above about 1.5 eV for SnS. The difference of about 0.4 eV between the band gap and the effective absorption threshold implies loss of efficiency in a solar cell. The disclosed alloying approach uses the transition from the orth to the rs crystalline structure to aid in inducing a direct band gap and more isotropic character of the band-structure and optical properties.

FIGS. 4a, 4b, and 4c show the calculated band gaps and the absorption spectra based on GW quasiparticle calculations for alloys having the composition of x=0.25 (4a and 4b left panel) and x=0.50 (4a and 4b right panel). Note that the absorption coefficients α have been determined within the independent particle approximation and do not include excitonic effects, which typically increase α by about one order of magnitude in the vicinity of the band gap, e.g., in orth SnS. While the Mg alloys exhibit a significant offset between the gap and the absorption onset, indicating an indirect character of the band gap, the Ca and Sr alloys behave instead more like a direct gap semiconductor, where band gap and absorption onset generally coincide. The actual observable parameter of interest is the absorption strength as a function of the photon energy above the band gap. At a composition of x=0.25, which roughly corresponds to the transition into the cubic rs structure, the band gap lies below that of orth SnS and increases up to 1.5 eV at x=0.50. Thus, this composition range is predicted to cover the range of band gap energies that is most interesting for single-junction photovoltaics.

To elucidate the origin of the more direct character and the magnitude of the band gaps, the calculated band structures of rs-SnS and CaS were determined and are shown in FIG. 5c. In the cubic rs structure, SnS has an inverted band gap, a feature that has recently attracted much interest in the context of topological insulators. Similar to the case of SnTe, which adopts rs as the ground state structure, the inversion occurs at the L point in the Brillouin zone. The inverted band gap is small, about 0.3 eV, with the valence band maximum (VBM) being at the L point, and the conduction band minimum (CBM) slightly off from the L point. CaS is a wide gap semiconductor with a calculated indirect gap of 5.2 eV, where the VBM is at the Γ and the CBM at the X point. When Ca is alloyed into rs SnS, the inversion at the L point may be reversed, leading to a situation similar to that of PbTe which is known as a semiconductor with a narrow direct band gap at the L point. Thus, the $Sn_{1-x}Ca_xS$ and $Sn_{1-x}Sr_xS$ alloys can be viewed as having a direct gap at the L point, which supports strong optical absorption due to the different parities of the VBM ($L_6^+$; Sn-s like) and CBM ($L_6^-$; Sn-p like).

Figure 8:
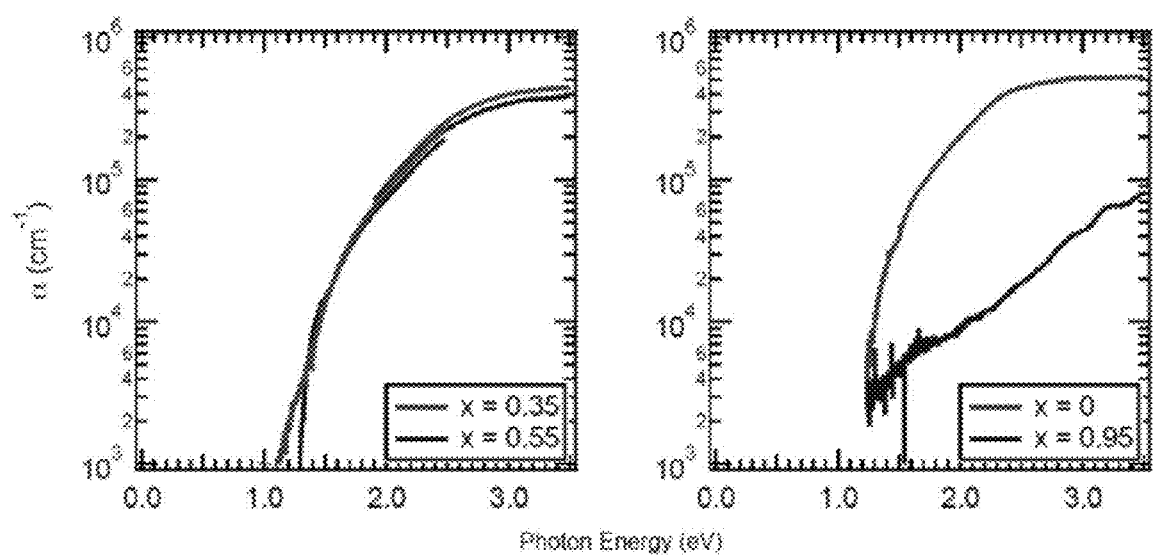
FIG. 8 shows the measured absorption spectra of $Sn_{1-x}Ca_xS$ thin films deposited on fused silica for (left panel) x=0.35 or 0.55 and (right panel) x=0 or 0.95.

FIG. 8(a) shows the results of optical measurements for films with moderate calcium content (x=0.35-0.55), indicating that the optical band gap varies from 1.1 to 1.3 eV and increases with rising Ca content. The absorption onset is steeper for the higher Ca concentration, which is a trend that—although less pronounced—is also seen in the theoretical data. For comparison, FIG. 4(b) shows also the absorption spectrum of orth SnS with an optical band gap of 1.25 eV. The indirect band gap at 1.07 eV, which was determined from measurements on bulk samples, is not visible in FIG. 4(b) because the respective indirect transitions with an absorption coefficient in the range of 1-100 per cm are too weak to be observable in a thin film. FIG. 8(b) shows further the optical spectrum for a film with approximately 95% calcium on the cation site, exhibiting a very slow onset of absorption with no obvious band gap. In this composition, Sn acts as a metallic impurity in CaS and causes a low level of absorption at all energies. While the absorption onset in the films shows the trends with compositions predicted by the calculations, the overall absorption spectra are more similar than the calculations predict.

In addition to the optical characterization, electrical measurements were also performed. The present (SnCa)S films were too resistive to determine the carrier mobility via the Hall effect, but thermopower measurements indicate that the films are p-type, with a Seebeck coefficient of 900-1900 μV/K, for films with 35%-55% Ca cation content.

While various aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

What is claimed is:

1. A photovoltaic thin film, comprising a tin alloy of formula (I):

$$Sn_{1-x}(R)_xS \qquad (I),$$

wherein,
R is selected from magnesium (Mg), calcium (Ca) and strontium (Sr);
x is not zero; and
the tin alloy is crystalline.

2. The thin film of claim 1, wherein the crystalline form of the tin alloy is selected from orthorhombic and rock salt.

3. The thin film of claim 1, wherein the crystalline form of the tin alloy is rock salt.

4. The thin film of claim 1, wherein R is selected from Ca and Sr.

5. The thin film of claim 3, wherein R is Sr and the tin alloy of formula 1 is $Sn_{1-x}Sr_xS$.

6. The thin film of claim 5, wherein x is selected from 0.2, 0.25 and 0.3.

7. The thin film of claim 3, wherein R is Ca and the tin alloy of formula 1 is $Sn_{1-x}Ca_xS$.

8. The thin film of claim 7, wherein the thin film displays an optical band gap of about 1.1-1.3 eV.

9. The thin film of claim 7, wherein x is selected from 0.2, 0.25 and 0.3.

10. The thin film of claim 1, having a thickness of about 100 nm-150 μm.

11. A photovoltaic device, comprising:
an absorber layer comprising a tin alloy of formula (I): $Sn_{1-x}(R)_xS$ (I); and
a buffer layer comprising a cadmium alloy of formula (II): $Cd_{1-y}(R^1)_yS$ (II); wherein:
R and $R^1$ are independently selected from magnesium (Mg), calcium (Ca) and strontium (Sr);
x and y are not zero;
the alloys of formulae (I) and (II) are crystalline; and
the buffer layer is lattice matched with the absorber layer.

12. The device of claim 11, wherein the crystalline form of the tin alloy of formula (I) and the crystalline form of the cadmium alloy of formula (II) are both rock salt.

13. The device of claim 11, wherein R and $R^1$ are independently selected from Ca and Sr.

14. The device of claim 11, wherein x and y have the same value.

15. The device of claim 14, wherein R and $R^1$ are both Ca.

16. The device of claim 14, wherein R and $R^1$ are both Sr.

17. The device of claim 15, wherein the ratio of tin:calcium and the ratio of cadmium:calcium is selected from: about 0.80:0.20 to about 0.20:0.80; about 0.70:0.30 to about 0.45:0.55; and about 0.75:0.25 to about 0.50:0.50.

18. The device of claim 16, wherein the ratio of tin:strontium and the ratio of cadmium:strontium is selected from about 0.80:0.20 to about 0.20:0.80; about 0.70:0.30 to about 0.45:0.55; and 0.75:0.25 to about 0.50:0.50.

19. The device of claim 11, wherein the absorber layer displays a band gap energy of 0.6-1.5 eV.

20. The device of claim 11, wherein the absorber layer has a thickness between about 100 nm and 150 μm.

\* \* \* \* \*